United States Patent [19]
Guerin et al.

[11] Patent Number: 5,412,677
[45] Date of Patent: May 2, 1995

[54] DATA-INSENSITIVE LASER DIODE POWER CONTROL

[75] Inventors: Jean-Michel Guerin, Glendale; Erwin R. Wechsler, La Crescenta, both of Calif.

[73] Assignee: Xerox Corporation, Stamford, Conn.

[21] Appl. No.: 239,147

[22] Filed: May 2, 1994

[51] Int. Cl.⁶ .................................... H01S 3/00
[52] U.S. Cl. .................................. 372/38; 372/29
[58] Field of Search .......................... 372/38, 29, 24

[56] References Cited

U.S. PATENT DOCUMENTS 4,528,525  7/1985  Eden et al. ........................... 372/24

Primary Examiner—Léon Scott, Jr.
Attorney, Agent, or Firm—Fariba Rad

[57] ABSTRACT

A laser diode is disclosed which utilizes a feedback system which substantially reduces the dependency of the optical output power of the laser diode on laser junction temperature which is dependent on the pixel pattern. The feedback system of this invention generates a feedback signal through comparison of an averaged train of pixel information against an averaged optical output power from the back photodiode of the laser diode. By comparing the two averaged signals, one can determine the fluctuations of the heat in the laser diode. At any given point, any discrepancy between the two averaged signals shows a temperature change in the laser diode. Depending on the amount of the difference between the two signals, the degree of excess temperature can be determined and the difference will be used for feedback correction.

2 Claims, 4 Drawing Sheets

DATA-INSENSITIVE LASER DIODE POWER CONTROL

BACKGROUND OF THE INVENTION

This invention relates generally to laser diodes and more particularly concerns a feedback system which compares an averaged train of pixel information against an averaged optical output power from the back photodiode in order to generate a feedback signal for adjusting the current of the laser diode to substantially correct the dependence of optical output power on laser junction temperature which is dependent on the pixel pattern.

Usually, in a scanning system, the light beam from the laser diode is modulated by a train of image pixel information. The pixel information is used to drive the diode and therefore stimulate laser emission where there is an On pixel. Since the emission of the light beam follows the pattern of the train of pixel information, this is called "modulation of the light beam by the train of pixel information". Hereinafter, pattern of the train of pixel information shall mean the pattern of the data change between the pixels of a train of pixel information; for example, from On to Off or from Off to On.

Due to the structure of the laser diode assembly, as the pattern of the train of pixel information changes, the temperature of the diode fluctuates which in turn causes the optical output power of the diode (intensity of the light beam) and the wavelength of the light beam, generated by the diode, to fluctuate. In a printing system, fluctuations of the optical output power cause fluctuations in the size of printed pixels which is not desirable.

The optical output power of a laser diode is highly sensitive to the temperature of the junction. When the laser diode is turned on, it heats up and typically within fifty to a few hundreds of microseconds causes its optical output power to settle down to a decreased output by several percents, a phenomenon called "droop".

In addition, droop is dependent on the pattern of the train of pixel information which is applied to the laser diode. Every time there is an On pixel, since the diode starts emitting light, the junction of the diode heats up. Due to this generated heat, the temperature of the diode increases. However, where there is an Off pixel, the diode does not generate any heat.

Therefore, the temperature of the diode depends on the pattern of the train of pixel information. As a result, the intensity of the light beam and therefore the size of the printed pixels depend on the pattern of the train of pixel information.

Minimizing the fluctuations of the optical output power would result in more accurate printed pages with improved image quality. Ideally, in order to keep the optical output power of the diode (intensity of the light beam) and the wavelength of the light beam generated by the diode constant, the temperature of the diode should be kept at a constant level. However, this requires the use of a thermoelectric cooler which is expensive and can not respond fast enough to fluctuations of the modulation duty cycle.

Typically, to reduce the fluctuations of the optical output power, a feedback system should be connected to the laser diode to generate a feedback signal in accordance with the fluctuations of the heat in order to adjust the current of the laser diode to change the optical output power as needed. Ideally, the feedback signal should be generated to correct within one pixel while the train of pixel information is being applied to the laser diode (real time).

However, high speed real time feedback systems have the disadvantages of being very expensive to construct, requiring extremely fast components to effectively measure and provide a real time response within a pixel. Therefore, some other methods must be found.

A conventional method of monitoring the optical output power of a laser diode measures the optical output power between the end of scan (EOS) and the start of scan (SOS). During this brief dead time between EOS and SOS, the optical output power is measured to generate a feedback signal in order to adjust the current of the laser diode. However, this method only measures the optical output power of the laser diode during the time that the train of pixel information is not applied to the laser diode.

SUMMARY OF THE INVENTION

In accordance with the present invention, a feedback system for a laser diode is disclosed which is capable of correcting the droop during the time that the train of pixel information is applied to the laser diode. The feedback system of this invention generates a feedback signal through comparison of an averaged train of pixel information against an averaged optical output power from the back photodiode of the laser diode. This enables a continuous feedback of the optical output power of the diode during the time that the train of pixel information is applied to the laser diode, without having to wait for the brief dead time between the end of scan (EOS) and the start of the scan (SOS) to sample the diode output.

DESCRIPTION OF THE PREFERRED EMBODIMENT

Figure 1:
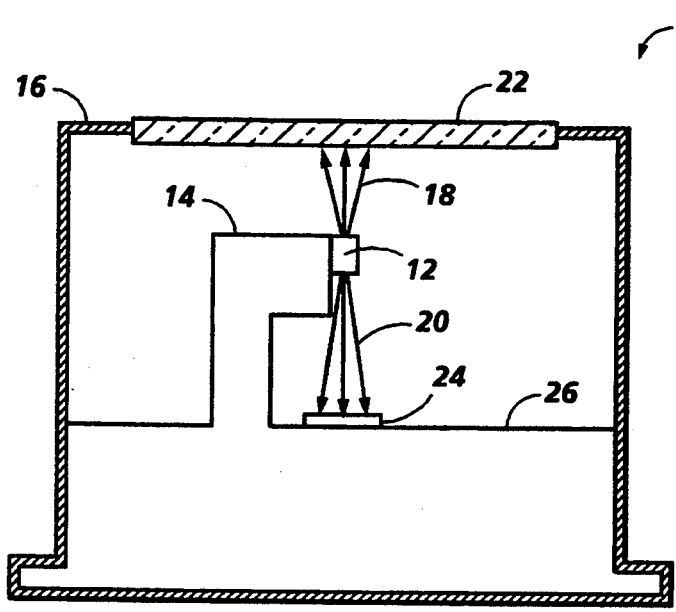
FIG. 1 shows a structure of a prior art laser diode.

Referring to FIG. 1, there is shown a structure 10 of a prior art laser diode. A laser diode 12 is secured on a flange 14 in a housing 16. The laser diode 12 emits light in two opposite directions 18 and 20. The optical output power of the light beam 18 and the optical output power of the light beam 20 are the same. The housing 16 contains a window 22 which allows the light beam 18 to be emitted outside of the housing. A back photodiode 24, which is also called backfacet diode, is located on the path of the light beam 20 and is secured on a plate 26. When the light beam 20 shines on the photodiode 24, the photodiode 24 generates a current which is proportional to the optical output power of the light beam 20.

Figure 2:
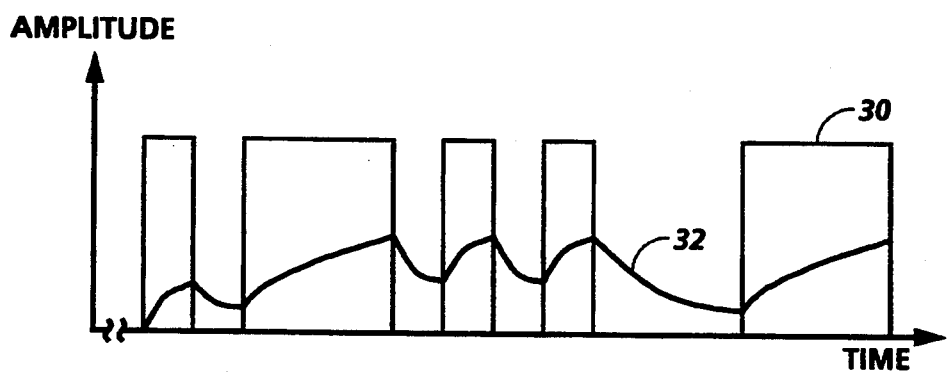
FIG. 2 shows a portion of a train of pixel information in which the pattern of the data change has a low frequency and also shows an averaged signal based on the same train of pixel information.

Referring to FIG. 2, there is shown a portion of the train of pixel information 30 which is applied to the laser diode 12 of FIG. 1. In FIG. 2, the horizontal axis represents time and the vertical axis represents amplitude. Also, in FIG. 2, the data change has a low frequency. Referring to both FIGS. 1 and 2, the laser diode 12 utilizes the train of pixel information 30 of FIG. 2 to modulate the light beams 18 and 20. Therefore, the light beams 18 and 20 will be On where there is an On pixel in the train of pixel information 30 and they will be Off where there is an Off pixel in the train of pixel information.

Ideally, the optical output power of the laser diode should be equal to the $V_{EXP}$ (the exposure level of the laser diode). However, in real world situations, the heat generated at the laser diode causes the optical output power (amplitude) to decrease.

To measure the optical power of the laser diode 12, the photodiode 24 is placed in the path of the light beam 20 to regenerate a signal which represents the optical output power of the laser diode 12.

If the response of the photodiode 24 was fast, it could generate a signal similar to the train of pixel information to represent the optical output power of the laser diode. In that case, the current from the photodiode could be compared to the train of pixel information to determine how accurate the laser diode is functioning However, due to the slow response of the photodiode 24, the photodiode 24 can not reproduce the optical output power of the laser diode which should represent the train of pixel information. Instead, it generates a current 32 (FIG. 2) which is the average of the optical output power of the laser diode and therefore current 32 can not be compared to the train of pixel information 30 since the shapes of the two signals are very different.

This invention utilizes the current from the photodiode 24 in a different manner. The data contained in the current 32 generated by the photodiode 24 is different than the train of pixel information, but it is accurate. Current 32 does not have any resemblance to the train of pixel information 30, however its upward slopes show the On pixels and its downward slopes show the Off pixels. It should be noted that current 32 responds to the train of pixel information 30 as shown in FIG. 2 only when the frequency of the data change is low.

Figure 3:
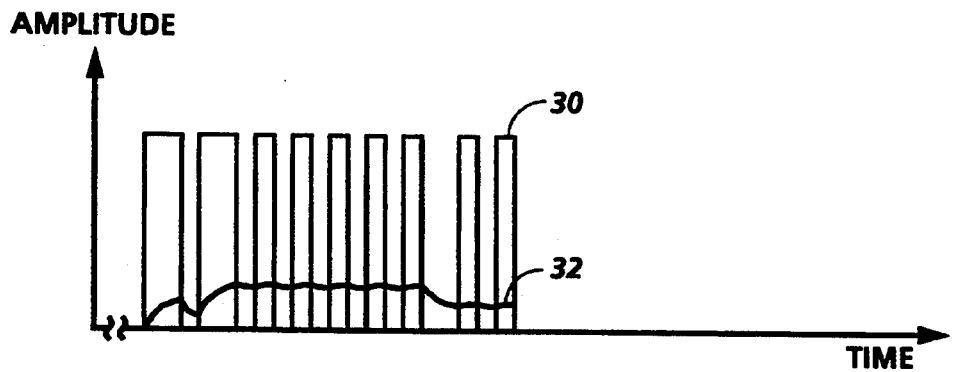
FIG. 3 shows another stage of the train of pixel information of FIG. 2 in which the pattern of the data change has a high frequency and also shows an averaged signal based on the same train of pixel information.

However, referring to FIG. 3, when the frequency of the data change within a train of pixel information is high, current 32 will not be able to sufficiently move up or down within each data change, as shown in FIG. 2. Therefore, the fluctuations of the current will be minimal which will result in an averaged current as shown in FIG. 3.

It should be noted that both FIGS. 2 and 3 show the same train of pixel infromation only at different stages.

In view of the output of the back photodiode both for the high frequency data change (FIG. 2) and the low frequency data change (FIG. 3), it can be concluded that the back photodiode 24 acts as a low pass filter.

Referring to FIGS. 1, 2 and 3, in order to compare the train of pixel information 30 to the current 32 from the photodiode 24, the train of pixel information 30 has to be averaged. The train of pixel information 30 is averaged through a circuit such as a low pass filter, then the averaged train of pixel information will have a similar signal shape as the current 32. In this case, the two signals can be compared to each other.

By comparing the two averaged signals, one can determine the fluctuations of the heat in the laser diode. If the two averaged signals are the same at all points, then the laser diode is at its best performance. However, if at any given point there is a discrepancy between the two averaged signals, it means that the temperature of the laser diode is changed. Depending on the amount of the difference between the two signals, the degree of excess temperature can be determined or the difference can be used for feedback correction. This method provides a way to monitor the fluctuations of the temperature based on the pixel pattern of the train of pixel information.

Figure 4:
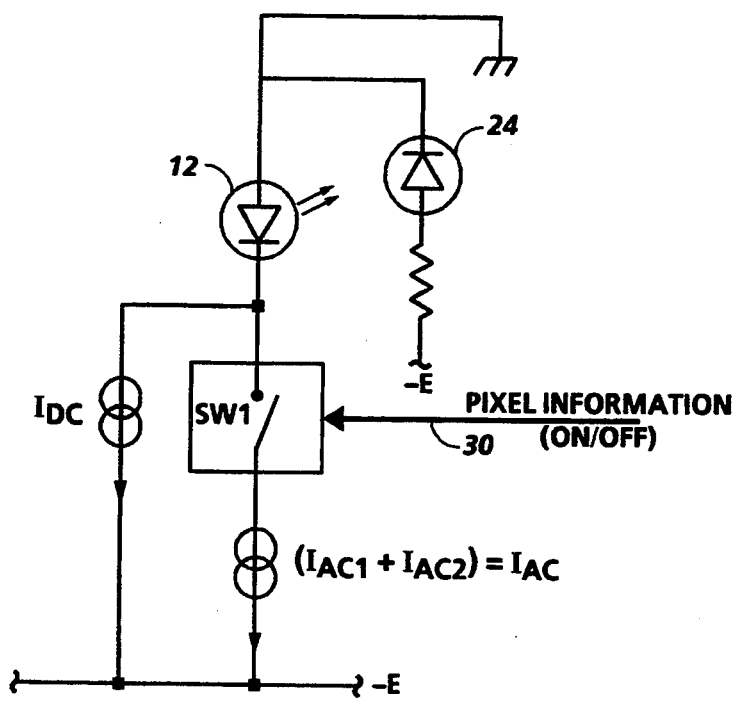
FIG. 4 shows a prior art circuit of the laser diode of FIG. 1 without a feedback system.

Referring to FIG. 4, there is shown a prior art circuit of the laser diode 12 of FIG. 1 without a feedback system. The laser diode 12 receives the addition of two currents $I_{DC}$ and $(I_{AC1} + I_{AC2})$.

Figure 5:
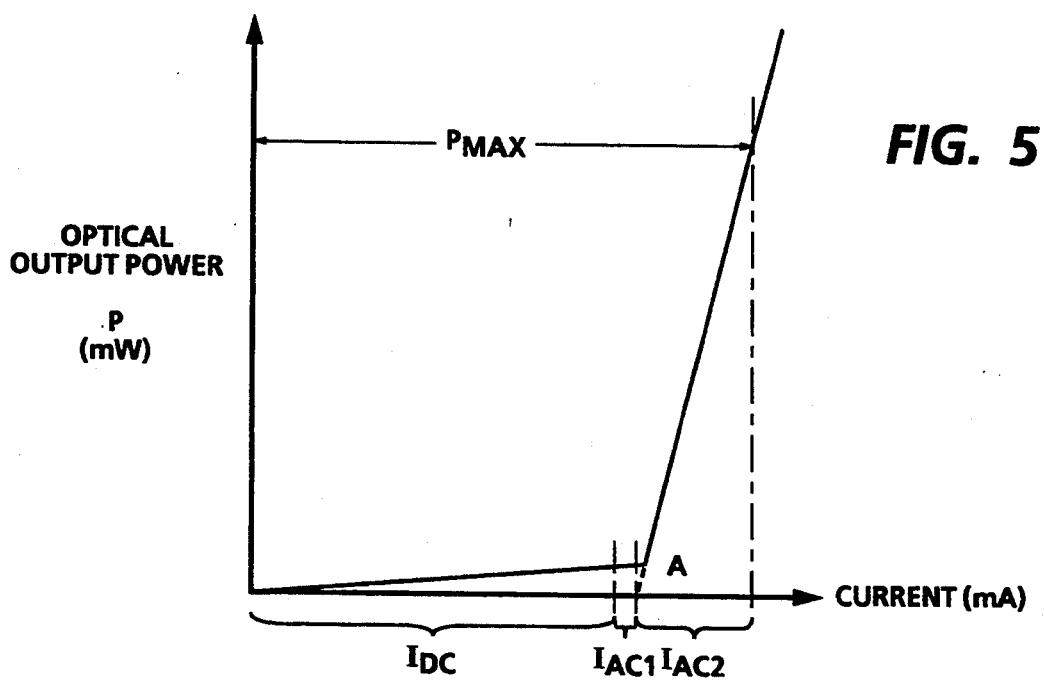
FIG. 5 shows a graph of the optical output power of the laser diode as a function of the applied current to the driver of the laser diode

Referring to FIG. 5, there is shown a graph of the optical output power of the laser diode as a function of the applied current to the driver of the laser diode. In FIG. 5, the vertical axis represents the optical output power of the laser diode and the horizontal axis represents current. $I_{DC}$ is the current that if it is applied to laser diode it does not cause the laser diode to emit, however it takes the laser diode close to the emitting point. Any additional current above $I_{DC}$ causes the laser diode to emit light. Current $(I_{AC1} + I_{AC2})$ is a current that if it is added to $I_{DC}$, it will cause the laser diode to emit at its maximum intensity. $I_{AC1}$ is the difference between $I_{DC}$ and the current needed to start emitting and $I_{AC2}$ is the difference between the current needed to emit at maximum intensity and the current needed to start emitting. However, for the purpose of this invention, $(I_{AC1} + I_{AC2})$ will be considered as one current "$I_{AC}$".

The reason for having $I_{DC}$ is to avoid a large current swing during modulation. By having $I_{DC}$ when emission is needed, $I_{AC}$ will be added to $I_{DC}$ and if no emission is needed $I_{AC}$ will be turned Off. Therefore, the current swing for turning the light On and Off will be equal to $I_{AC}$ and there will be no need to shut the current of the laser diode completely Off which would require a much larger swing.

Referring back to FIG. 4, a train of pixel information 30 will be applied to a switch $SW_1$ which connects the $I_{AC}$ to $I_{DC}$. Where there is an On pixel, the switch $SW_1$ closes and $I_{AC}$ will be added to $I_{DC}$ and where there is an Off pixel, the switch $SW_1$ opens and $I_{AC}$ will be stopped.

Figure 6:
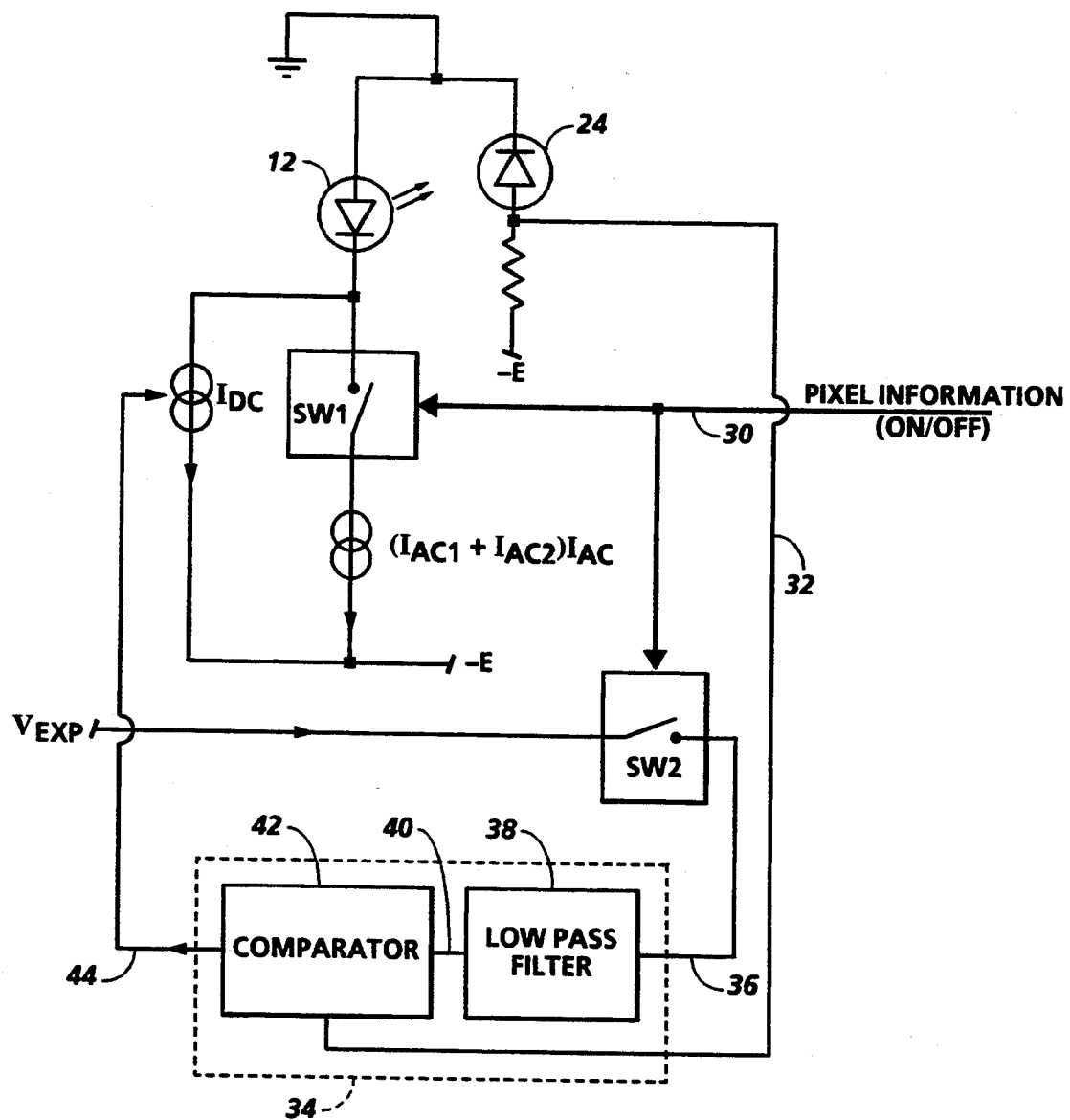
FIG. 6 shows a circuit diagram of this invention which utilizes the current from the back photodiode to generate a feedback signal.

Referring to FIG. 6, there is shown a circuit diagram of this invention which utilizes the current from the back photodiode to generate a feedback signal to correct the optical output power fluctuations of the laser diode due to temperature fluctuations. In this FIG. 6, the same parts as those described before are designated by same reference numerals.

Laser diode 12 receives the addition of the two currents $I_{DC}$ and $I_{AC}$. When the laser diode 12 starts emitting, it shines some light onto the back photodiode 24. Photodiode 24 generates a current 32 which will be sent to a comparator 42 in the feedback generating block 34. A train of pixel information 30 is applied to switch $SW_1$ which connects $I_{AC}$ to $I_{DC}$ where there is an On pixel and disconnects the $I_{AC}$ from $I_{DC}$ where there is an Off pixel and therefore it modulates the light beam of the laser diode 12.

The train of pixel information 30 as well as $V_{EXP}$ are connected to switch $SW_2$. The function of $SW_2$ is to apply $V_{EXP}$, which is a selected exposure level for the laser diode, to the train of pixel information 30. The output signal 36 of the switch $SW_2$ is the train of pixel information 30 which is adjusted to have a DC level equal to the $V_{EXP}$. The reason for applying $V_{EXP}$ to the train of pixel information is that the laser diode is set to emit light with $V_{EXP}$. AS a result, the current generated by the back photodiode is based on $V_{EXP}$. Therefore, to generate an average train of pixel information comparable to the current 32 from the back photodiode 24, the DC level of the train of pixel information must be adjusted to the $V_{EXP}$.

The train of pixel information 30 controls switch $SW_2$. Where there is an On pixel, the switch $SW_2$ closes and a pulse with $V_{EXP}$ amplitude will be sent out and where there is an Off pixel, the switch $SW_2$ opens and the output will be zero. The output signal 36 of switch $SW_2$ is connected to a low pass filter 38 of the feedback generating block 34.

Figure 7:
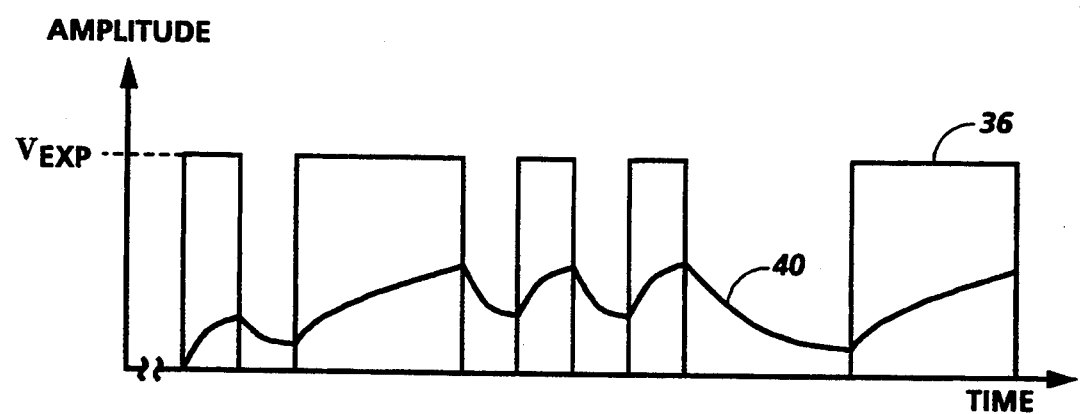
FIG. 7 shows an input signal which is adjusted to have an amplitude equal to the exposure level of the laser diode and also shows an averaged signal based on the same train of pixel information.

Referring to FIG. 7, there is shown a signal 36 which is applied to the low pass filter 38 of FIG. 6 through switch $SW_2$ of FIG. 6. Referring to both FIGS. 6 and 7, signal 36 is a duplicate of the optical output power that the laser diode 12 should generate and it is used as a reference signal to be compared with the optical output power of the laser diode. However, since the optical output power of the laser diode is represented by the current 32 from the back photodiode 24 which is an average of the optical output power, signal 36 has to be averaged to be comparable with the current 32. Therefore, signal 36 will be sent to the low pass filter 38 to be averaged.

The low pass filter 38 generates an averaged train of pixel information signal 40 and sends it to comparator 42. Comparator 42 receives both current 32 from the back photodiode 24 and the averaged train of pixel information 40 and compares them to each other. Once the comparator 42 compares the two signals 32 and 40, depending on the difference between the two signals, it generates a feedback signal 44. If there is any discrepancies between the two signals 32 and 40, the comparator 42 will generate signal 44 and if the two signals are the same, the output signal 44 of the comparator 42 will be zero. Then, the feedback signal 44 will be applied to the current generator of $I_{DC}$ to adjust the $I_{DC}$ as needed. The lager the difference between the two signals 32 and 40, the more $I_{DC}$ has to be changed.

It should be noted that the feedback signal 44 can also be applied to $I_{AC1}$ or to $I_{AC2}$ or to the sum of $I_{AC1} + I_{AC2}$.

It should also be noted that different approaches to the design of this circuit can be taken. For example, the low pass filter 38 and the comparator 42 can be combined into an op-amp.

What is claimed is:

1. A laser diode feedback system for determining fluctuations of heat in the diode ad for keeping the temperature of the diode at a generally constant level, said system comprising:
   diode means for emitting a light beam;
   said diode means having a back photodiode and having a selected exposure level;
   a feedback generating means;
   exposure level applying means;
   means for supplying a train of pixel information to said diode means for modulating said light beam of said diode means and to said exposure level applying means to generate a train of pixel information with a DC level equal to the exposure level of said diode means;
   said train of pixel information, with a DC level equal to the exposure level, being electrically connected to said feedback generating means for generating a feed back signal;
   means for providing current to said diode means;
   said back photodiode being located in such a manner that it receives a portion of said modulated light beam;
   said back photodiode generating an electric signal in response to said modulated light beam representing temperature at said diode means;
   said electric signal being the average of said train of pixel information;
   said feedback generating means being operably connected to said
   back photodiode means for receiving said electric signal;
   said feedback generating means averaging said train of pixel information; with a DC level equal to the exposure level to represent a desired constant temperature level at said diode means and comparing said averaged train of pixel information with a DC level equal to the exposure level to said electric signal in such a manner that if said averaged train of pixel information and said electric signal are not the same, it will generate a feedback signal representing fluctuation between the desired constant temperature and the temperature at said diode means and if said averaged train of pixel information and said electric signal are the same, it will not generate a feedback signal; and
   said current providing means being operably connected to said feedback generating means for receiving said feedback signal and for adjusting the current to said diode means in response to said feedback signal to keep the temperature of said diode means at a generally constant level.

2. The circuit as recited in claim 1, wherein said exposure level applying means is a switch.

* * * * *